United States Patent [19]
Allen et al.

[11] Patent Number: 5,608,207
[45] Date of Patent: Mar. 4, 1997

[54] SENSOR WITH AUTOMATIC GAIN CONTROL

[75] Inventors: Barbara A. Allen, Rockford; David A. Klein; Hongzhi Kong, both of Freeport, all of Ill.

[73] Assignee: Honeywell Inc., Minneapolis, Minn.

[21] Appl. No.: 449,513

[22] Filed: May 23, 1995

[51] Int. Cl.$^6$ .................................................. H01J 40/14
[52] U.S. Cl. ............................... 250/214 AG; 250/559.4; 250/222.1; 340/556; 356/385
[58] Field of Search .................... 250/214 AG, 222.2, 250/221, 223 B, 222.1, 223 R, 559.4, 559.24, 226; 356/240, 429, 430, 384–386, 41; 340/555–557; 327/514

[56] References Cited

U.S. PATENT DOCUMENTS

| | | | |
|---|---|---|---|
| 3,522,739 | 8/1970 | Coor et al. | 356/41 |
| 3,910,701 | 10/1975 | Henderson et al. | 250/226 |
| 4,655,349 | 4/1987 | Joseph et al. | 356/240 |

Primary Examiner—Que T. Le
Attorney, Agent, or Firm—William D. Lanyi

[57] ABSTRACT

A sensor system is provided with an amplifier that has as an input signal received from a light sensitive component. The output of the amplifier is determined by its gain factor. The output of the amplifier is continually monitored to determine whether it is in acceptable limits. When a change is required, a variable potentiometer is affected to change its resistance. The variable potentiometer is included as part of a feedback loop of the amplifier and, therefore, a change in its resistance will change the gain factor of the amplifier and achieve the appropriate magnitude of output signal from the amplifier. The system can be operated in either a pushbutton mode or an automatic gain control mode. In the pushbutton mode, the system responds to an operator request for a setup procedure to be accomplished. In the automatic gain control mode, the system determines when an object is not present within a detection zone and, using the presently received signal magnitudes, determines the necessary change in gain factor to achieve a signal with an acceptable magnitude. A digital potentiometer is affected in order to change its resistance which is included as an incremental part of the feedback loop of an amplifier.

5 Claims, 8 Drawing Sheets

SENSOR WITH AUTOMATIC GAIN CONTROL

BACKGROUND OF THE INVENTION

1. Field of the Invention

The present invention relates generally to a sensor for detecting the presence of an object and, more particularly, to a sensor which comprises an amplifier and a means for dynamically changing the gain of the amplifier in response to changing conditions.

2. Description of the Prior Art

Many types of sensors are known to those skilled in the art. One particular type of sensor is a photoelectric sensor that comprises both a light source and a light sensitive component although other types of radiation can also be used. The light source can be received by the light sensitive component according to any one of a number of procedures that are well known to those skilled in the art. The light beam that is transmitted from the light source to the light sensitive component is disposed through a region where objects are expected to move. When an object breaks or affects the light beam passing from the light source to the light sensitive component, the presence of the object is detected. When solid objects are being detected by a photoelectric sensor, a fixed threshold magnitude can be used to compare with the intensity of light received by the light sensitive component and thereby detects the attenuation of the light beam as a result of the presence of an object between the light source and light sensitive component. When transparent or nearly transparent objects are to be detected, the use of a fixed threshold magnitude is often unsatisfactory because of the very slight change in the intensity of the light beam that occurs when it passes through the transparent or nearly transparent object. In certain applications where transparent objects are to be detected, such as in the detection of glass or plastic bottles, the decrease in the intensity of the light beam is so small that the effectiveness of the photoelectric sensor can be seriously diminished by changing conditions such as temperature, age or mist in the region of the light beam. These changing conditions can be caused by a change in the ambient conditions or a degradation in the operation of the light source. If, for example, an LED is used as the light source, aging or changes in temperature can seriously affect the intensity of light transmitted by the light emitting diode. This decrease in intensity of the light beam emitted by the light emitting diode is difficult to distinguish from the decrease in light intensity received by the light sensitive component when a transparent or nearly transparent object is attenuating the beam.

In view of these problems that can occur in certain applications of photoelectric sensors, it would therefore be significantly beneficial if an efficient means were provided to adjust the sensitivity of the detection system in response to changes in environmental conditions or the intensity of light emitted by the light source.

SUMMARY OF THE INVENTION

The present invention provides a sensor that has the capability of changing the gain of an amplifier so that the intensity of a received light signal can be amplified to a degree which maximizes the operational efficiency of the sensing system. In a preferred embodiment of the present invention, the sensor comprises a radiation source which can be a light emitting diode or any other appropriate means for providing a beam of light. In addition, a preferred embodiment of the present invention comprises a radiation sensitive device which provides a first signal that is representative of an intensity of radiation imposed on the radiation sensitive device. This device can be a photodiode or a phototransistor. The radiation sensitive device is disposed at a location to receive a beam of radiation from the radiation source. Although many different arrangements of radiation sources and radiation sensitive devices are known to those skilled in the art, two possible configurations include a thru-scan arrangement and a reflective arrangement which will be described in greater detail below.

A preferred embodiment of the present invention further comprises an amplifier for receiving the first signal provided by the radiation sensitive device as an input signal and providing an output signal that is representative of the input signal. The magnitude of the output signal is related to the magnitude of the input signal by a predetermined gain factor. In addition, a preferred embodiment of the present invention comprises a means for comparing the output signal to a first threshold magnitude. The present invention further comprises a means for changing the gain factor as a function of the comparative magnitudes of the output signal and the first threshold magnitude.

It should be understood that several embodiments of the present invention are included within its scope. For example, the present invention can be configured to determine an appropriate gain factor for the amplifier during a setup procedure. This embodiment is responsive to an operator request that the gain factor be determined. Another possible application of the present invention is an automatic gain control process by which the gain factor of the amplifier is dynamically changed during normal operation of the sensor when appropriate circuitry determines that the light beam is not attenuated. This could occur dynamically in between the times when objects are passing through the light beam.

In a particularly preferred embodiment of the present invention, the changing means comprises a variable resistor that is capable of being affected by an external signal to alter its effective resistance. The variable resistor can be connected in a feedback circuit of the amplifier and the amplifier can be an operational amplifier in an electronic circuit. Also included in a preferred embodiment of the present invention is a means for comparing the output signal to a second threshold magnitude in order to assure that the magnitude of the output signal from the amplifier is between the magnitudes of the first and second threshold magnitudes.

BRIEF DESCRIPTION OF THE DRAWINGS

The present invention will be more fully and completely understood from a reading of the Description of the Preferred Embodiment in conjunction with the drawings, in which.

DESCRIPTION OF THE PREFERRED EMBODIMENT

Figure 1:
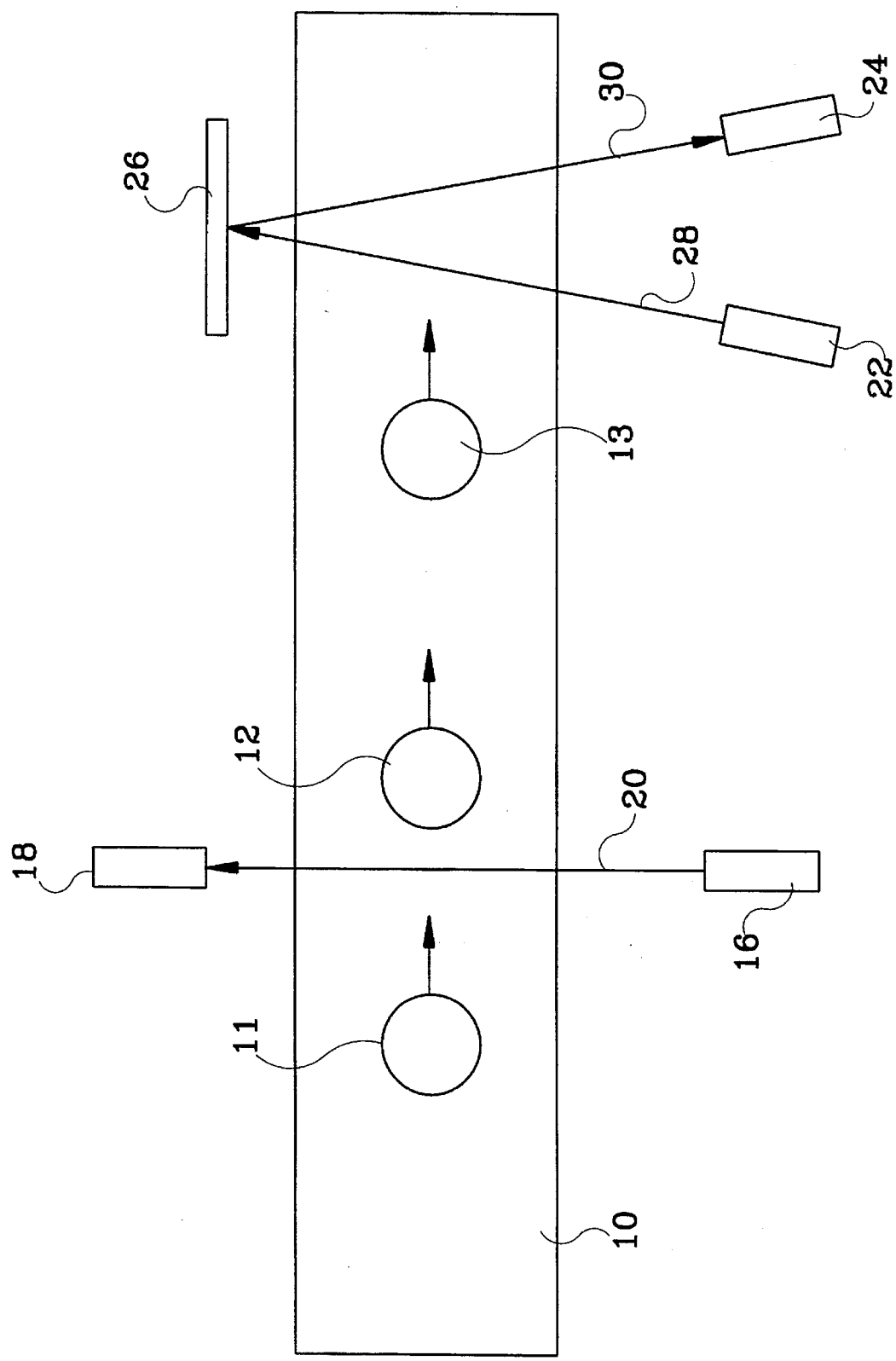
FIG. 1 is a highly schematic representation of two possible arrangements of a photoelectric sensor.

Throughout the Description of the Preferred Embodiment, like components will be identified by like reference numerals.

FIG. 1 illustrates two known configurations that can be used by a photoelectric detector to determine the presence or absence of an object within a predetermined detection zone. It should be understood that the two configurations illustrated in FIG. 1 are representative in nature and exemplary for the purpose of showing possible arrangements in which the present invention can be applied. However, it should be understood that the illustrations in FIG. 1 are not limiting to the present invention. For purposes of this illustration, a conveyor 10 is shown with a plurality of objects, 11–13, moving in the direction represented by their associated arrows. Two different photoelectric arrangements are shown in FIG. 1. One arrangement comprises a light source 16 and a light sensor 18. The light source 16 provides a beam of light 20 that is received by the light sensor. When the beam 20 is attenuated, or blocked, by an object passing on the conveyor 10, associated circuitry can determine that an object is within the detection zone between the light source 16 and the light sensor 18. An alternative arrangement is shown in the right portion of FIG. 1, wherein a light source 22 is associated with a light sensor 24 and a reflector 26. It should be understood that the light source 22 and the light sensor 24 are commonly contained in a single housing although this is not a requirement. A transmitted light beam 28 is provided by the light source 22 and directed toward the reflector 26. The transmitted light beam 28 is reflected by the reflector 26 and the reflected beam 30 is received by the light sensor 24. If an object passes through the detector zone, the attenuation of the light beam can be detected by associated electronic circuitry. The two arrangements shown in FIG. 1 represent two of the possible applications of the present invention as will be described in greater detail below.

Figure 2:
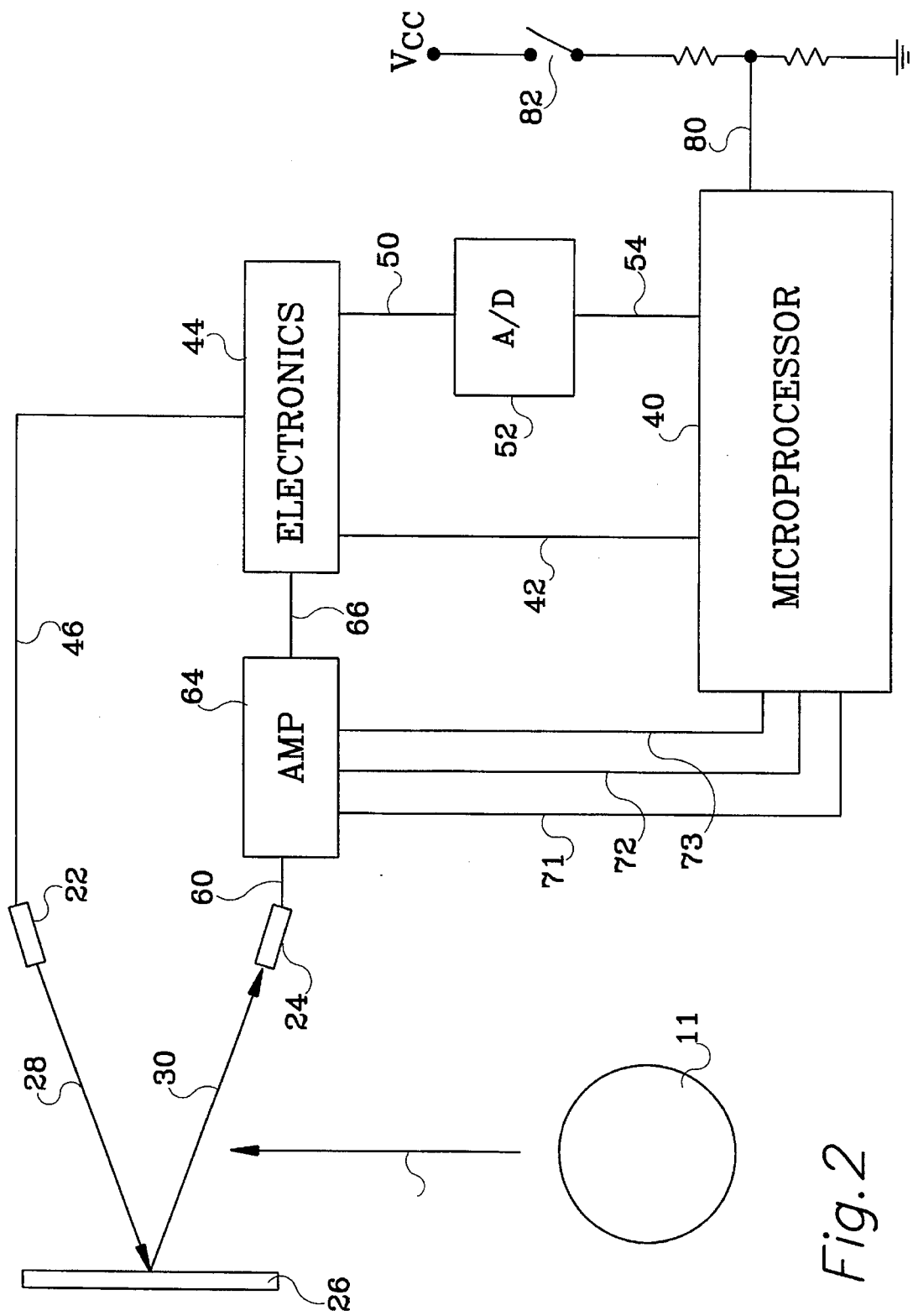
FIG. 2 shows a schematic illustration of one embodiment of the present invention.

FIG. 2 shows a schematic representation of the present invention associated with a reflective sensor arrangement such as that illustrated in the right half of FIG. 1. In an embodiment of the present invention that comprises a microprocessor 40, the microprocessor 40 provides a signal on line 42 to associated electronics 44 that control the light source 22. The electronics identified by reference numeral 44 in FIG. 2 are well known to those skilled in the art and will not be described in detail herein. The electronics 44 provide the necessary control of the light source 22 which may involve the activation of the light source 22 at a preselected pulse frequency and the control of the current provided to the light source. In addition, the electronics 44 provide a signal on line 50 that is received by an analog-to-digital converter 52 that, in turn, provides a digital signal on line 54 to the microprocessor. The digital signal received on line 54 by the microprocessor 40 represents the intensity of light received by the light sensitive component 24.

The light sensitive component 24 provides a first signal, on line 60, which is directly representative of the intensity of light received by the light sensitive component 24. This signal on line 60 is amplified by the amplifier 64 and the amplified signal is provided on line 66 to the electronics 44. In other words, the analog signal provided on line 50 to the analog-to-digital converter 52 is a function of the degree of amplification provided by the amplifier 64.

In FIG. 2, three lines are shown between the microprocessor 40 and the amplifier 64. These three lines, 71–73, allow the microprocessor to control the gain factor of the amplifier 64. The ability for the microprocessor 40 to control the gain factor of the amplifier 64 provides one of the significant advantages of the present invention. If, for any reason, the intensity of light received by the light sensitive component 24 decreases below an acceptable range or increased above an acceptable range, the magnitude of the output signal from the amplifier 64 on line 66 may become unacceptable for the efficient and accurate operation of the sensing system. When the microprocessor 40 senses the fact that the output signal on line 66 is not within appropriate limits, it can take the necessary action to change the gain factor of the amplifier 64 and thereby change the magnitude of the output signal on line 66. Through the normal operation of the electronics 44, this will effectively change the magnitude of the digital signal on line 54 that is used by the microprocessor to determine the presence or absence of an object, such as that represented by reference numeral 11 in FIG. 2, within the detection zone.

With continued reference to FIG. 2, an input signal can be provided to the microprocessor on line 80 that indicates a request by an operator for the execution of a gain adjustment. This can be done by closing switch 82. In a typical application of the present invention, switch 82 can be a pushbutton that an operator can activate in order to cause the microprocessor 40 to execute a gain adjustment. As will be described in greater detail below, the present invention can be operated under at least two modes. One mode is an operator induced gain correction that would typically be utilized during set up procedures. Another mode of operation of the present invention would include the dynamic correction of the gain factor during the normal operation of the sensor when bottles are intermediately passing through the detection zone.

Figure 3:
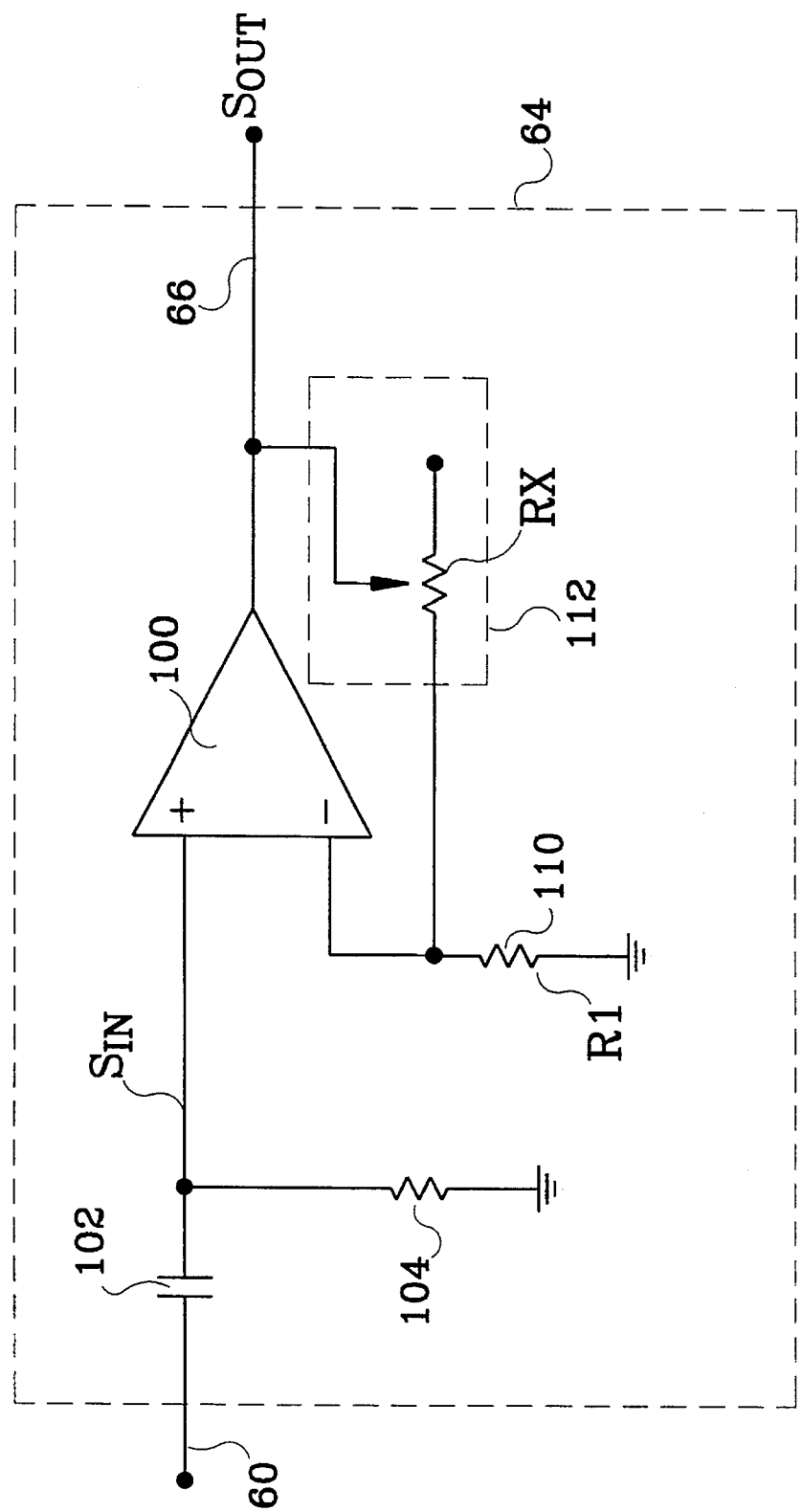
FIG. 3 is an enlarged representation of an amplifier used in conjunction with the preferred embodiment of the present invention.

FIG. 3 is an illustration of the amplifier 64 described above in conjunction with FIG. 2. In one particularly preferred embodiment of the present invention, the amplifier 64 comprises an operational amplifier 100. Line 60 is connected, through a capacitor 102 to a noninverting input of the operational amplifier 100. The capacitor 102 and the resistor 104 are associated together to provide filtering of the input on line 60. The input signal SIN is provided to the amplifier 100.

As shown in FIG. 3, the inverting input of the operational amplifier 100 is connected to a point of ground potential through a resistor 110 and another resistor 112 is combined with resistor 110 to provide a feedback loop of the operational amplifier 100. In FIG. 3, the resistor 112 is illustrated as a variable resistor whose resistance RX is determined by the position of a wiper that is an integral portion of resistor 112. For purposes of the following discussion, the resistance of resistor 110 is identified as R1. The combination of the resistances, R1 and RX, determines the gain factor of the operational amplifier 100 and, therefore, determines the magnitude of the output signal $S_{OUT}$ on line 66.

Figure 4:
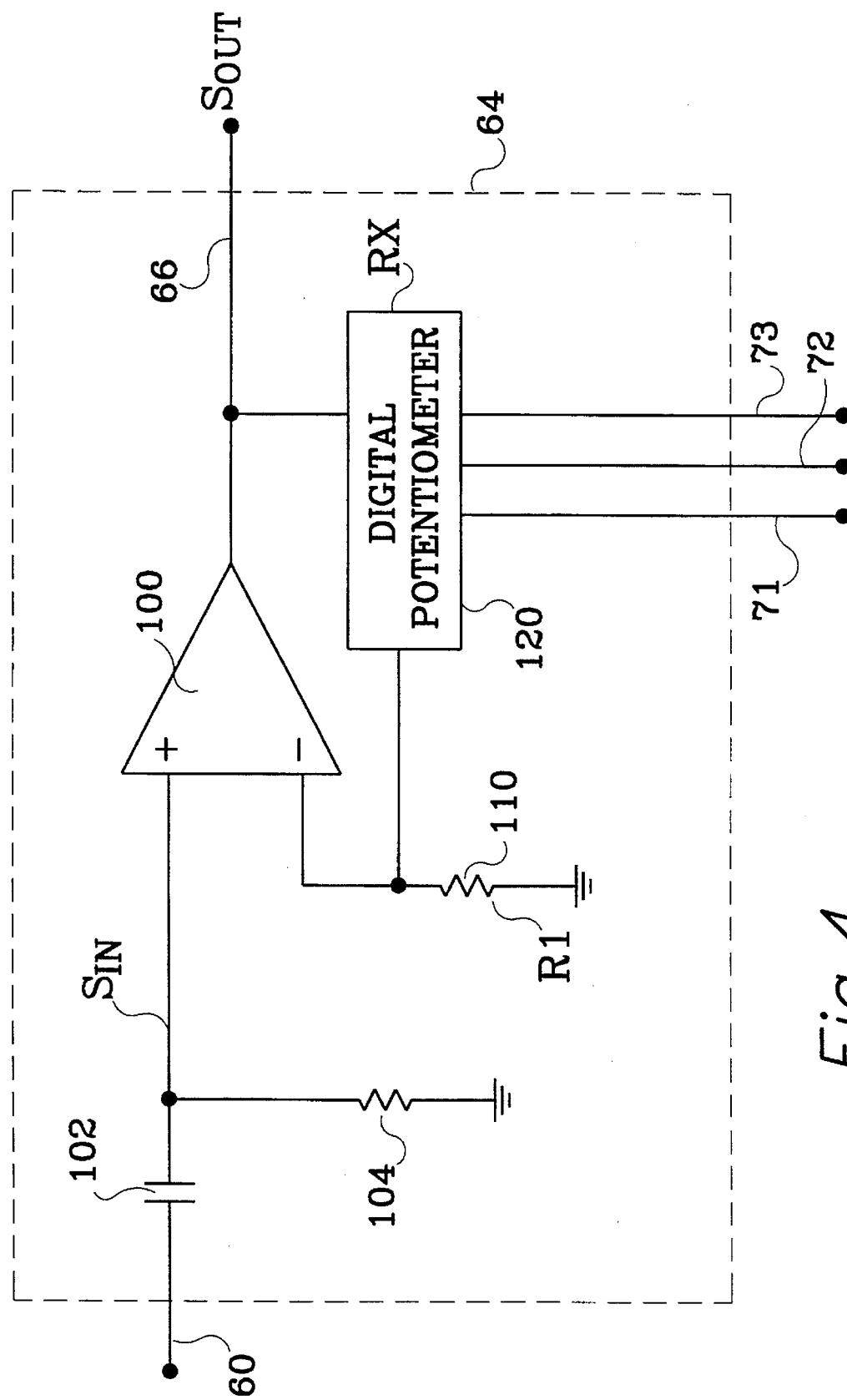
FIG. 4 is similar to FIG. 3, but with a digital potentiometer used in the feedback loop of the amplifier.

FIG. 4 is a representation that is generally similar to that of FIG. 3, but with a digital potentiometer 120 being applied as the variable resistor 112. Various types of digital potentiometers are known to those skilled in the art. For example, a digital potentiometer identified as Catalog Number X9CMME is available in commercial quantities from the Xicor Corporation. A digital potentiometer 120 of this general type comprises three basic sections. A first section comprises an input control, a counter and a decode section. A second section comprises nonvolatile memory and a third section comprises a resistor array. The input control section operates like an up/down counter. The output of the counter is decoded in order to activate a single electronic switch that connects a point on the resistor array to a wiper output. Under proper conditions, the contents of the counter can be stored in nonvolatile memory and retained for future use. The resistor array comprises one hundred resistance values that are connected in series. At either end of the array and between each resistor is an electronic switch, such as a transistor, that transfers the potential at that point in the circuit to the wiper.

With continued reference to FIG. 4, appropriate digital signals provided on lines 71–73 can control the digital potentiometer 120 so that it has a desired effective resistance. This effective resistance RX combines with resistance R1 of resistor 110 to determine the gain factor of the operational amplifier 100. This gain factor, in turn, determines the magnitude of the output signal $S_{OUT}$ relative to the input signal $S_{IN}$.

With reference to FIGS. 2 and 4, it can be seen that the microprocessor 40 can respond to the magnitude of the digital signal on line 54 and change the gain of amplifier 64 by providing the appropriate signals on lines 71–73. The microprocessor 40 can be programmed to make the appropriate change in the gain factor of amplifier 64 based on a predetermined set of threshold magnitudes as will be described in greater detail below.

Figure 5:
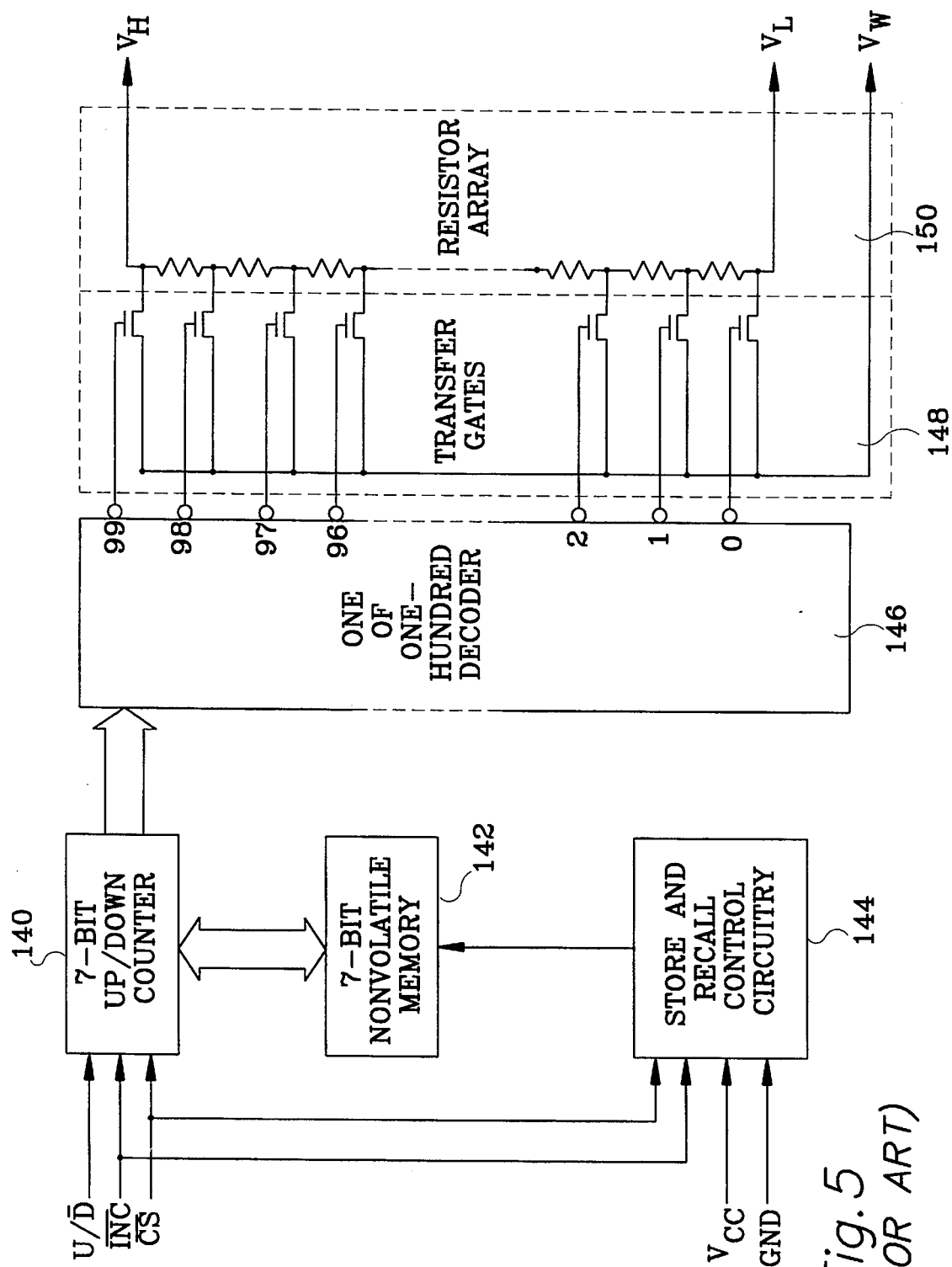
FIG. 5 represents a schematic illustration of one known type of digital potentiometer.

Although many different types of digital potentiometers can be used in conjunction with the present invention, the digital potentiometer identified as Catalog Number X9CMME by the Xicor Corporation is illustrated schematically in FIG. 5. It comprises a seven bit up/down counter 140, a seven bit nonvolatile memory 142 and a store and recall control circuit 144. In addition, the digital potentiometer comprises a decoder that has a resolution of one hundred points. It should be understood that alternative potentiometers could be selected to have different degrees of resolution, depending on the intended application of the present invention. The transfer gates 148 comprise a plurality of switches, such as transistors, and the resistor array 150 comprises a plurality of resistors connected in series. One of the transistors is closed at any given time and the resulting circuit through preselected resistors determines the effective resistance provided by the digital potentiometer 120 in FIG. 4.

Although the present invention can be utilized in many different sensor configurations, one particularly preferred embodiment of the present invention is applicable for use in conjunction with a photoelectric sensor that is applied to detect the presence or absence of relatively transparent objects, such as glass or plastic bottles, passing through a detection zone. One particular system of this type is described in U.S. Pat. No. 5,496,996 which was filed on Jan. 24, 1995 and assigned to the Assignee of the present application (M10-15805). In that patent application, various algorithmic procedures are described in detail. U.S. Pat. No. 5,496,996 is hereby explicitly incorporated by reference in this patent application. The specific steps taken during the object detection process will not be described herein. However, it should be understood that most detection schemes related to the detection of transparent or nearly transparent objects can benefit significantly by determining the threshold magnitudes as a function of the intensity of light received when no object is attenuating the light beam instead of the older, well known, technique of using a fixed threshold value. Although the use of a fixed threshold value is satisfactory when opaque objects are being sensed, the decrease in light intensity caused by the attenuation of a light beam by a transparent or nearly transparent object is generally not sufficient to permit the use of a fixed threshold value with which the light intensity is compared.

Figure 6:
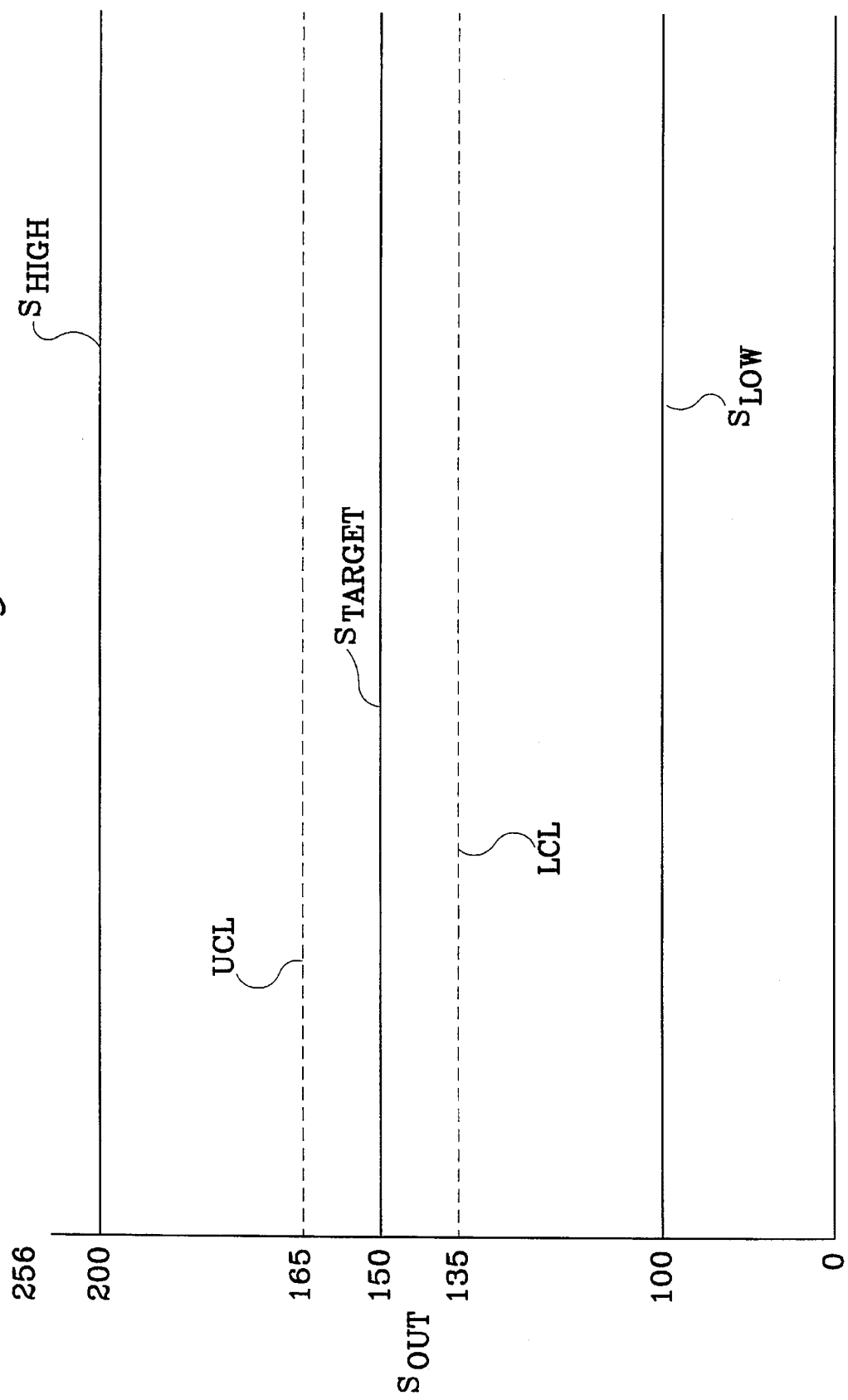
FIG. 6 is a graphical representation of various magnitudes used by the preferred embodiment of the present invention to maintain an appropriate signal level.

FIG. 6 is an exemplary graphical representation of various intensity levels that will be used in the following description of the present invention. The vertical axis in FIG. 6 represents the output signal $S_{OUT}$ that was described above in conjunction with FIGS. 3 and 4. However, for purposes of this description, the output signal $S_{OUT}$ illustrated in FIG. 6 represents the digital signal provided on line 54 by the analog-to-digital converter 52 to the microprocessor 40. Although the output signal $S_{OUT}$ discussed in conjunction with FIGS. 3 and 4 is analog in nature and provided on line 66 as the output from the amplifier 64, it should be understood that the digital signal on line 54 provided by the analog-to-digital converter 52 is representative of the same magnitude, but in a digital form. If the digital output signal $S_{OUT}$ has a maximum achievable magnitude of two hundred and fifty-six, FIG. 6 shows various threshold magnitudes that can possibly be used in conjunction with the present invention. It can be determined that an optimum signal of one hundred and fifty is desirable when no object is attenuating the light beam. It can also be determined that a digital signal $S_{OUT}$ that is greater than two hundred is disadvantageous for various reasons. This threshold is identified as $S_{HIGH}$ in FIG. 6. Similarly, it can be determined that a digital output signal $S_{OUT}$ that is lower than one hundred is undesirable. This is identified as threshold $S_{LOW}$ in FIG. 6. FIG. 6 also shows an upper control limit UCL and a lower control limit LCL equally offset on both sides of the $S_{TARGET}$ threshold line. The terminology and symbolism shown in FIG. 6 will be used below in the description of an algorithm according to a preferred embodiment of the present invention.

Figure 7:
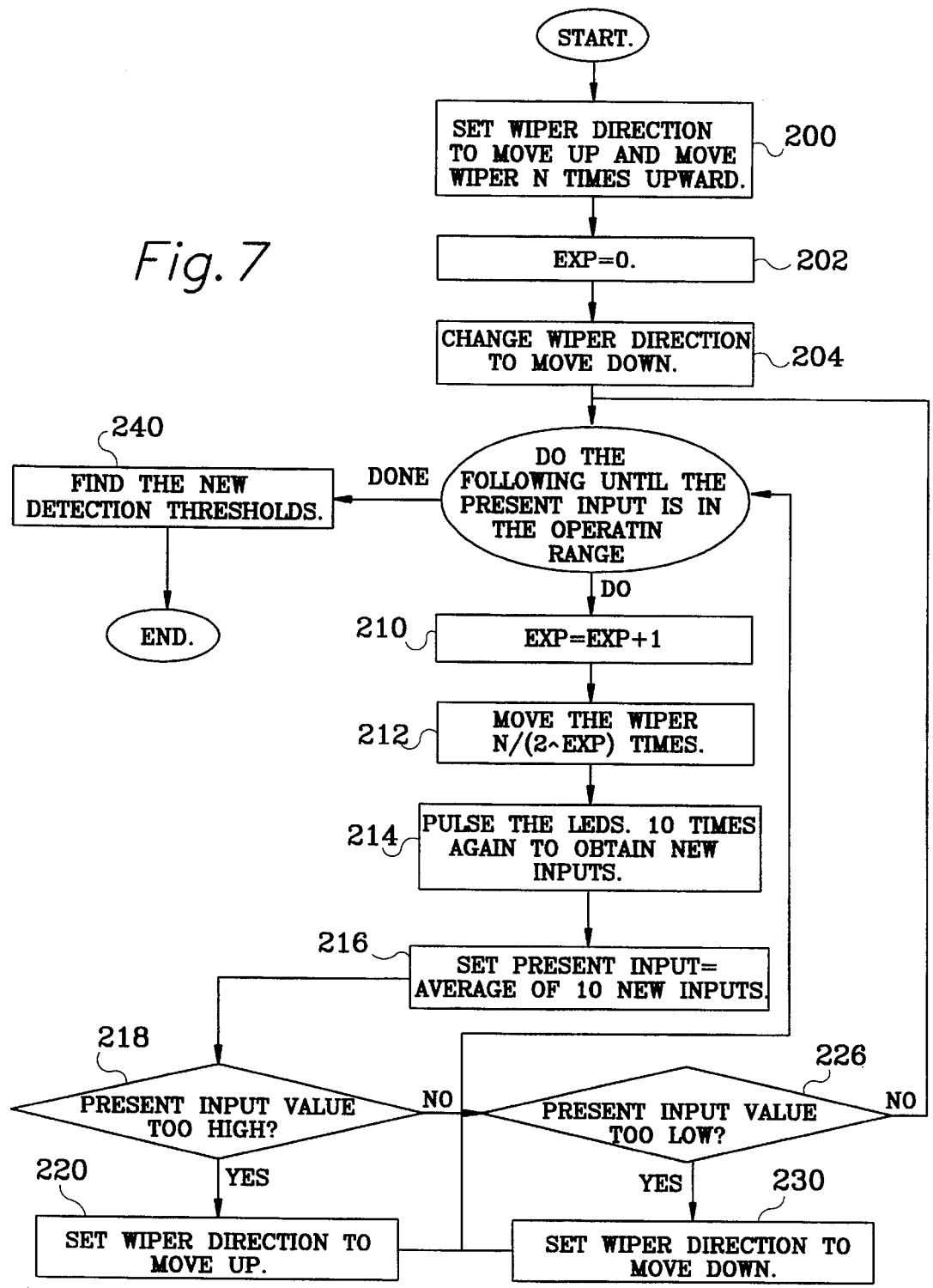
FIG. 7 is a flow chart that is applicable to the pushbutton mode of the preferred embodiment of present invention.

FIG. 7 shows a flow chart that represents the program contained in the microprocessor 40 described above in conjunction with FIG. 2. In FIG. 7, the flow chart represents the step by step procedure that is implemented by the microprocessor in response to an operator pushing the push button represented as the switch 82 shown in FIG. 2. When the switch is closed, a signal is provided to the microprocessor. In response to this signal, the microprocessor provides the appropriate signals on lines 71–73 to set the wiper direction of the digital potentiometer 120 to move up and it also attempts to move the wiper of the digital potentiometer N times upward, where N is the size of the resistor array. Since the microprocessor 40 had stored the current location of the wiper in its memory, it can reset the wiper as indicated by function block 200 in FIG. 7. A counter EXP is set to zero, as indicated in function block 202 and the wiper direction is changed to move downward as represented in function block 204. As shown in the instruction loop of FIG. 7, the program repeatedly increments the EXP counter, moves the wiper a number of times that is equal to the maximum resolution of the potentiometer divided by two taken to the exponent EXP. These steps are shown in function blocks 210 and 212. The light source 22 is pulsed ten times in order to get a representative indication of the intensity of light received by the light sensitive component 24. This step is identified in function block 214. The ten signals received by the light sensitive component 24 are averaged, at function block 216, and this value is compared to a predetermined threshold, at decision block 218. If the average of the ten samples is too high, the wiper direction is moved up and the steps are repeated. If the average magnitude of the ten samples is not too high compared to the threshold, it is checked to see if it is too low, as represented by function block 226. If it is too low, the wiper direction is moved down, at block 230, and the steps are again repeated. At any time, if the average value of the ten sample signals is within the desired operating range, the set up procedure is completed and a new set of detection thresholds is determined, as indicated by function block 240.

As represented by the flow chart in FIG. 7, the basic theory of operation during a push button gain procedure is to set the digital potentiometer to one extreme value and then take ten samples of the light intensity received by the light sensitive component. It should be understood that other sample sizes are also possible. If the average magnitude of the samples is not within range, the resistance of the digital potentiometer is moved by a magnitude that is half of the maximum possible change within the resolution of the potentiometer. On the next trial, the change in the resistance of the potentiometer is half of the previous step taken during the first trail. Each succeeding change of the resistance of the potentiometer is generally equal to approximately half the previous change during the previous step. In this way, the resistance RX of the potentiometer is moved toward its desirable magnitude $S_{TARGET}$ in an efficient manner. When the resulting digital output $S_{OUT}$ is between the upper control limit and the lower control limit shown in FIG. 6, the process is terminated and an appropriate set up is achieved.

Figure 8:
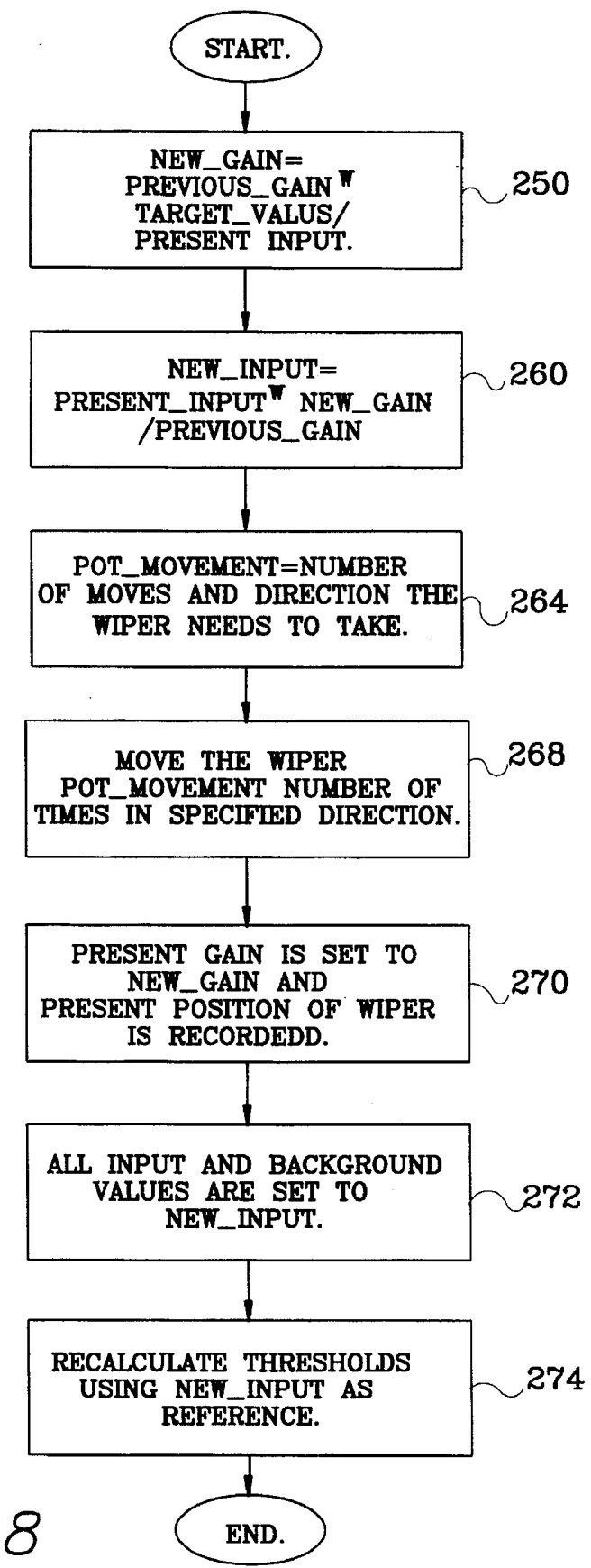
FIG. 8 is a flow chart of a dynamic automatic gain control mode of the preferred embodiment of present invention.

During the normal operation of the sensor, it is desirable that the microprocessor be able to perform an automatic gain control procedure without having to stop the detection process. In many applications of photoelectric sensors, associated electronics and microprocessor capability is provided that can accurately determine the presence or absence of an object in the detection zone. According to a preferred embodiment of the present invention, the automatic gain control can be performed between the detection of objects in the detection zone. In other words, when no object is detected within the light beam, the present invention can quickly and accurately change the gain factor of the amplifier in order to optimize the magnitude of the signal provided by the light sensitive component when no object is attenuating the beam. A flow chart for this procedure is illustrated in FIG. 8. Although many algorithmic techniques can be used to determine the presence or absence of an object in the detection zone when the object is a transparent or nearly transparent object, one particularly preferable technique is described in U.S. Pat. No. 5,496,996. Regardless of the procedure used to determine when no bottle is attenuating the beam, the present invention can be operated in its automatic gain control mode during that period between attenuations of the beam by the objects being detected. In FIG. 8, the first step of the algorithmic process is the setting of a new gain variable equal to the previous gain multiplied by the ratio of the target value divided by the present input. The target value $S_{TARGET}$ is shown in FIG. 6, the previous gain is the gain resulting from existing status of the variable potentiometer, and the present input is the digital signal received by the microprocessor 40 on line 54 from the analog-to-digital converter 52. This digital value is actually the digital output $S_{OUT}$ that is received as an input by the microprocessor 40. This calculation is represented in functional block 250 in FIG. 8. A new input value, as shown in functional block 260, is determined as the present input multiplied by the ratio of the new gain factor divided by the previous gain factor. In other words, the new input is equal to the present digital output on line 54 multiplied by the ratio of the new gain factor provided by the variable potentiometer divided by the previous gain factor provided by the variable potentiometer 120. The microprocessor 40 then determines the appropriate potentiometer movement as shown in functional block 264 and moves the wiper the appropriate number of times to achieve this potentiometer movement. This step is identified in functional block 268. Following these steps, the present gain is set to the new gain and the present position of the wiper is stored. This is shown in functional block 270. All values are updated, as shown in functional block 272, and the microprocessor recalculates the detection thresholds using the new values as a reference. This is identified in functional block 274. The various thresholds used by the transparent object detection algorithms are immediately updated, as shown in functional block 274, in order to prevent the possible incorrect determination of the presence of a bottle immediately following the automatic gain control process. The steps shown in FIG. 8, simply determine whether or not the light intensity, as measured by the output signal $S_{OUT}$, is between the high limit $S_{HIGH}$ and low limit $S_{LOW}$. If the signal is between these limits, no action is taken. If, on the other hand, the signal is not within those limits, a correction factor is determined by observing the difference between the desired target level $S_{TARGET}$ and the current intensity level received. The differences are used to determine the appropriate correction step by which the wiper of the variable potentiometer is moved. The present invention can implement this automatic gain control procedure at any time when no object is detected within the detection zone.

The automatic gain control capability of the present invention has been described in conjunction with a microprocessor based photoelectric sensor and a digital potentiometer. Two different operational modes of the present invention have been described. One can be activated by a pushbutton during an initial set up of the sensor or during periodic calibration procedures. These calibrations are performed in response to an operator request. The other mode of operation can be activated by preselected conditions during the normal operation of the sensor. Under both modes of operation, the gain of an amplifier is changed by changing the resistance of a digital potentiometer until the detected signal is within a predetermined range. During the pushbutton mode, the resistance change is achieved by a sequence of steps in which each step is generally equal to half of the previous step and of a direction that is suitable for achieving a proper gain factor. During the automatic gain control procedure that occurs while the sensor is operating in a dynamic manner, the microprocessor determines the magnitude of gain that is needed to amplify the currently received signal into a predetermined range and the gain is changed accordingly.

Photoelectric sensors achieve a proper signal-to-noise ratio by amplifying the detected signal with a proper gain factor. In certain applications, particularly when transparent or nearly transparent objects are to be detected, the signal levels must be kept within a certain range in order to detect the small changes in light intensity that are caused when a transparent or nearly transparent object attenuates the light beam. Because the detected signal level is dependent on the optical alignment and scan range of the device, a manual adjustment of either the sensor gain or the threshold level is usually required. However, this type of manual adjustment requires special tooling and a high degree of skill. The present photoelectric sensor market demands that simple and easy set up procedures be provided in the sensor design. The advantages of a push button set up are that the manual adjustment is eliminated and variations of light emitting diode power and sensitivity of photosensitive devices will no longer critically affect the consistency of the photoelectric sensor's performance. In addition, the detected signal level of a photoelectric sensor may drift during operation. Possible causes for this drift include environmental changes, contamination of the optics, emitter or receiver aging and other changes. The signal drift can lead to false detection in certain applications, such as when transparent or nearly transparent objects are to be detected. In certain applications, such as that described above with reference to U.S. Pat. No. 5,496,996, a floating reference technique is used with a microprocessor based photoelectric sensor. One possible limitation of a sensor system of this type is its dynamic range of operation. For example, an 8 bit microprocessor has only 256 gray levels. If the detected signal level in the absence of an object attenuating the light beam is too high (e.g. above two hundred and fifty-six) or too low (e.g. below fifty), the sensor system will either be saturated or loose its resolution and be unable to sense changes that are less than 2%. Therefore, it is desirable to increase the dynamic range of operation so that the sensor can compensate for larger changes in the manner that it is intended to operate. Conventional closed loop gain control techniques are not appropriate in this type of application. In order to detect the presence of an object, the adjustment of the gain must be performed under known conditions, such as when no object is present. The detection thresholds must also be adjusted according to the change of gain for continuous detection.

In the pushbutton mode, a high digital input signal is detected by the microprocessor when the switch is closed by the operator. The microprocessor resets the variable gain to a known initial value and then compares the return signal from the analog-to-digital converter to a preselected target value. If the return signal is not within the target range, the microprocessor will change the variable gain until the signal is within the target range. The final gain factor will be stored by the microprocessor.

With reference to FIGS. 3 and 4, it should be understood that the gain of the amplifier is given by equation 1.

$$G = 1 + RX/R1 \qquad (1)$$

In equation 1, RX is a resistance of the variable resistor, such as the digital potentiometer 120. In a digital potentiometer such as the one specifically identified above, N equal resistor elements are provided and a maximum resistance of RE is possible. The resistance of each element is RO equal RE/N. Therefore, the gain of the operational amplifier 100 can be controlled as a function shown in equation 2.

$$GN = 1 + (m*R0)/R1 \qquad (2)$$

where m is a number of resistor elements in use and can achieve digital values from zero to N.

When operated in the automatic gain control (AGC) mode during the normal object detection sequence performed dynamically by the sensor, the microprocessor constantly compares an updated reference signal received from the analog-to-digital converter with high and low threshold levels. If the reference signal is higher than the high threshold or lower than the lower threshold, and no object is within the light beam, the automatic gain control mode is activated. Conventional close loop gain control can not be used in this instance because the sensing condition may be changed when an object is leaving or entering the detection zone. The microprocessor must move the wiper of the digital potentiometer a number of times continuously. In order to adjust the reference signal the required change in the gain is determined and the digital potentiometer is affected to achieve the desired resistance that will provide a gain factor that is necessary to change the output signal to a magnitude within the acceptable range.

Although the present invention has been described with particular detail and illustrated with significant specificity, it should be understood that modifications and alternate embodiments are within its scope.

The embodiments of the invention in which an exclusive property or right is claimed are defined as follows:

1. A sensor, comprising:

a radiation source for directing a beam of radiation through a detection zone through which one or more partially transparent objects can pass;

a radiation sensitive device for receiving said beam of radiation after said beam of radiation has passed through said detection zone, the intensity of said beam of radiation received by said radiation sensitive device being attenuated when one of said partially transparent objects moves into said detection zone, said radiation sensitive device providing a first signal representative of said intensity of radiation imposed on said radiation sensitive device, said radiation sensitive device being disposed to receive said beam of radiation from said radiation source after said beam of radiation has passed through said detection zone;

an amplifier for receiving said first signal as an input signal and providing an output signal, whereby the magnitude of said output signal is related to the magnitude of said input signal by a predetermined gain factor;

first means for comparing said output signal to a first threshold magnitude, said first comparing means comprising a means for determining whether one of said partially transparent objects is attenuating said beam of radiation and a means for selecting a sample of said output signal when said beam of radiation is not attenuated by one of said partially transparent objects; and means for changing said gain factor as a function of the comparative magnitudes of said output signal and said first threshold magnitude when none of said partially transparent objects is attenuating said beam of radiation.

2. The sensor of claim 1, wherein:

said changing means comprises a variable resistor that is capable of being affected by an external signal to alter its effective resistance.

3. The sensor of claim 2, wherein:

said variable resistor is connected in a feedback circuit of said amplifier.

4. The sensor of claim 3, wherein:

said amplifier is an operational amplifier.

5. The sensor of claim 1, further comprising:

second means for comparing said output signal to a second threshold magnitude to assure that the magnitude of said output signal is between the magnitudes of said first and second threshold magnitudes.

* * * * *